United States Patent [19]

Youlton

[11] Patent Number: 4,960,491

[45] Date of Patent: Oct. 2, 1990

[54] PROCESS FOR ETCHING ORGANIC POLYMERIC MATERIALS

[75] Inventor: Henry G. Youlton, Southampton, United Kingdom

[73] Assignee: International Business Machines Corporation, Armonk, N.Y.

[21] Appl. No.: 463,248

[22] Filed: Jan. 10, 1990

[30] Foreign Application Priority Data

Jan. 13, 1989 [GB] United Kingdom ............... 89007801

[51] Int. Cl.$^5$ .................... B44C 1/22; B29C 37/00; C03C 15/00; C03C 25/06
[52] U.S. Cl. .................... 156/668; 156/659.1; 252/79.2; 252/79.5
[58] Field of Search .................... 156/654, 655, 659.1, 156/668, 902; 252/79.2, 79.5; 427/307; 204/129.1, 129.65

[56] References Cited

U.S. PATENT DOCUMENTS

| | | | |
|---|---|---|---|
| 3,235,426 | 2/1966 | Bruner et al. | 156/668 |
| 4,281,034 | 7/1981 | Narayan | 156/668 |
| 4,334,949 | 6/1982 | Ameen et al. | 156/642 |
| 4,606,998 | 8/1986 | Ciodgo | 430/312 |

FOREIGN PATENT DOCUMENTS 0337342 4/1989 European Pat. Off. .

Primary Examiner—William A. Powell
Attorney, Agent, or Firm—Calfee, Halter & Griswold

[57] ABSTRACT

An improved process for etching of polymeric materials, in particular polyimide, by reaction with either an acid or alkaline etching solution is described. A reactive material, such as aluminum metal, is added to the etching solution in order to generate nascent hydrogen. The generation of this gas promotes the etching process by increasing the etching rate and dispersion of the etch residue.

7 Claims, No Drawings

PROCESS FOR ETCHING ORGANIC POLYMERIC MATERIALS

The present invention relates to a process for wet etching of an organic polymeric material, and is of particular relevance to the manufacture of integrated circuits.

Polyimides are a class of thermally stable polymer with low dielectric constant and, as such, have been found to be suitable material for insulating substrates in flexible printed circuits. In general the formation of a laminated integrated circuit requires that the polyimide be etched, either to improve its adherence properties, or to provide pathways through the material. U.S. Pat. No. 4,606,998 illustrates a particular, but not atypical, example of a process for forming a patterned interconnection layer on a semiconductor substrate. In this a metal layer is applied to a polyimide layer in which vias have been formed by anisotropic etching through a photoresist mask.

Attempts have been made to improve the patterning process by removing one or more processing steps. Ultrapure and photosensitive polyimides have been developed in an effort either to increase their adhesive properties, or to remove the need for adhesion of a photoresist mask. However, in none of the prior art have efforts been made to actually shorten the etching time. Normally for wet etching of a polyimide, a strong alkaline solution is employed at an elevated temperature. In addition to degradation of the resist adhesion, other difficulties encountered with this process are long etch times, and the formation of a non-dispersable etch residue.

The process as claimed is intended to remedy these drawbacks providing a means for etching of an organic polymeric material by reaction with an etching solution, characterized in that the reaction is promoted by the etching solution also interacting with a reactive material to generate hydrogen.

A specific embodiment of the invention will now be described, by way of example. However, it would be clear to one skilled in the art that hydrogen gas can be generated in several ways; for example by interaction of reactive metal (that is it lies above hydrogen in the electrochemical series) with aqueous solutions of either acid or alkali. Indeed, it is also clear that organic polymers other than polyimide and either acid or alkaline etching solutions could be employed. In addition the hydrogen may be generated in situ by an electrochemical process.

In one embodiment of the process, three thousandths of an inch polyimide film is cleaned and coated with a photoresist layer which is exposed and developed. The film is etched by being placed in a 500 grm/liter solution of potassium hydroxide maintained at 85° C. for approximately five minutes, with the addition of a slug of aluminum metal. The aluminum slowly dissolves liberating a stream of hydrogen bubbles. Finally, the resist is stripped and the etched surface passivated in a 10% solution of hydrochloric acid at a temperature of 80°-90° C. The process results in the etching rate being at least doubled, with increased dispersion of the etch residue in the solution and with less degradation of the resist adhesion. Indeed the resist adhesion is improved still further if the polyimide is subjected to such an etchant for a few seconds, washed and dried, prior to the application of the resist.

The above process alleviates the difficulties of slow and problematic etching of organic polymers, in particular polyimides, and should be of particular value in the manufacture of printed circuits from a laminate. Another example of a manufacturing process which could benefit from this development is in the coloring of polyesters, where etching or scouring of the fibers is a necessary treatment prior to dyeing.

I claim:

1. A process for etching an organic polymeric material by reaction with an etching solution, characterized in that the reaction is promoted by the said solution also interacting with a reactive material to generate hydrogen.

2. A process as claimed in claim 1, wherein the reactive material is a dissolving metal.

3. A process as claimed in claim 2, wherein the dissolving metal is aluminum.

4. A process as claimed in claim 1, wherein the etching solution is an alkaline solution.

5. A process as claimed in claim 4, wherein the alkaline solution is a hydroxide.

6. A process as claimed in claim 1, wherein the etching solution is an acid solution.

7. A process as claimed in claim 1, wherein the polymeric material is polyimide.

* * * * *